United States Patent
Ho et al.

(10) Patent No.: US 7,257,018 B2
(45) Date of Patent: Aug. 14, 2007

(54) METHOD AND APPARATUS FOR A LOW WRITE CURRENT MRAM HAVING A WRITE MAGNET

(75) Inventors: ChiaHua Ho, Hsin-chu (TW); Yi-Chou Chen, Hsin-chu (TW); Ruichen Liu, Hsin-chu (TW)

(73) Assignee: Macronix International Co., Ltd. (TW)

( * ) Notice: Subject to any disclaimer, the term of this patent is extended or adjusted under 35 U.S.C. 154(b) by 137 days.

(21) Appl. No.: 10/735,114

(22) Filed: Dec. 12, 2003

(65) Prior Publication Data

US 2005/0128793 A1   Jun. 16, 2005

(51) Int. Cl.
*G11C 11/00* (2006.01)

(52) U.S. Cl. .................. 365/158; 365/171; 365/157

(58) Field of Classification Search ............. 365/158, 365/145, 157, 97, 155
See application file for complete search history.

(56) References Cited

U.S. PATENT DOCUMENTS

| | | | |
|---|---|---|---|
| 6,483,741 B1 * | 11/2002 | Iwasaki et al. ............. | 365/170 |
| 6,501,678 B1 * | 12/2002 | Lenssen et al. ............. | 365/173 |
| 6,538,918 B2 * | 3/2003 | Swanson et al. ............ | 365/158 |
| 6,603,678 B2 * | 8/2003 | Nickel et al. ............... | 365/171 |
| 6,704,220 B2 * | 3/2004 | Leuschner ................... | 365/173 |
| 6,791,792 B2 * | 9/2004 | Takahashi ................... | 360/112 |
| 6,829,162 B2 * | 12/2004 | Hosotani ..................... | 365/173 |
| 6,927,995 B2 * | 8/2005 | Nickel et al. ............... | 365/158 |
| 2005/0105328 A1 * | 5/2005 | Ho .............................. | 365/158 |

* cited by examiner

*Primary Examiner*—Thong Q. Le
(74) *Attorney, Agent, or Firm*—Martine Penilla & Gencarella, LLP

(57) ABSTRACT

An invention is provided for a low write current MRAM. Each MRAM cell includes a word line and a bit line. A magnetic device is disposed at the intersection of the word line and the bit line. Disposed at either end of the magnetic device is a writing magnet. The pair of writing magnets switches a magnetic alignment of the magnetic device during a write operation. In aspect, the pair of writing magnets and the magnetic device can be aligned along a long axis of the memory cell, which generally is not aligned with either the word line or the bit line.

20 Claims, 13 Drawing Sheets

METHOD AND APPARATUS FOR A LOW WRITE CURRENT MRAM HAVING A WRITE MAGNET

BACKGROUND OF THE INVENTION

1. Field of the Invention

This invention relates generally to computer storage and more particularly to a low current magnetic random access memory using a write magnet.

2. Description of the Related Art

The use of personal computers has expanded remarkably in recent years. As such, long-term computer data storage devices, such as hard disk, have become increasingly important to computer users. To keep up with demand for improved long-term computer data storage, Magnetic Random Access Memory ("MRAM") has been developed. MRAM is a non-volatile memory that can be utilized for long-term data storage. MRAM devices perform read and write operations orders of magnitude faster than can be performed using conventional long-term storage devices such as hard drives. In addition, MRAM devices are more compact and consume less power than other conventional long term storage devices.

A typical MRAM device includes an array of memory cells. Word lines extend along rows of the memory cells, and bit lines extend along columns of the memory cells. Each memory cell is located at a cross point of a word line and a bit line. A memory cell stores a bit of information as an orientation of a magnetization. The magnetization orientation of each memory cell assumes one of two stable orientations at any given time. These two stable orientations, parallel and anti-parallel, represent logic values of "1" and "0. " Supplying a current to a word line and a bit line crossing a selected memory cell changes the magnetization orientation of a selected memory cell by creating two orthogonal magnetic fields that, when combined, switch the magnetization orientation of the selected memory cell from parallel to anti-parallel or vice versa.

However, switching of the memory cells is not always reliable. Sometimes, the combined magnetic fields might not cause a memory cell to switch reliably from parallel to anti-parallel, or vice-versa. This problem is typically solved by increasing crystal anisotropy, coercivity or aspect ratio of the memory cells.

However, increasing the crystal anisotropy, coercivity or aspect ratio leads to another problem: the amount of current for switching the memory cells is increased. Increasing the amount of current increases the amount of power consumed by the MRAM device. In addition, increasing the amount of current requires larger bit lines, word lines, and write circuits to handle the higher currents, resulting in a larger, more expensive, MRAM device.

Therefore, a need exists to improve reproducibility or reliability of switching MRAM devices without increasing the switching current.

SUMMARY OF THE INVENTION

Broadly speaking, embodiments of the present invention address these needs by providing an MRAM cell that utilizes a magnetic device and two writing magnets to store information. In one embodiment, an MRAM cell is disclosed. The MRAM cell includes a word line and a bit line perpendicular to the word line. In addition, a magnetic device is disposed at the intersection of the word line and the bit line. Disposed at either end of the magnetic device is a writing magnet. The pair of writing magnets switches a magnetic alignment of the magnetic device during a write operation. In aspect, the pair of writing magnets and the magnetic device can be aligned along a long axis of the memory cell. In this aspect the long axis of the memory cell generally is not aligned with either the word line or the bit line. The magnetic device can include either a magnetic tunnel junction (MJT), a giant magnetoresistance (GMR) material, a colossus magnetoresistance (CMR) material, an anisotropic magnetoresistance (AMR) material, or other similar material as will be apparent to those skilled in the art after a careful reading of the present disclosure.

A method for performing a write operation to an MRAM cell is disclosed in an additional embodiment. The method includes supplying a current to a word line and a bit line of the MRAM cell. The currents in the word line and the bit line generate a magnetic field that is applied to a pair of writing magnets disposed at either end of a magnetic device. The writing magnets in turn generate a field strength capable of switching a magnetic alignment of the magnetic device. In one aspect, the current applied to the word line and the bit line is on an order of magnitude of 100 μA. Each writing magnet can include a soft ferromagnetic material, or alternatively, each writing magnet can include a general ferromagnetic material, depending the particular design of the memory array.

An MRAM array is disclosed in a further embodiment of the present invention. The MRAM array includes a plurality word lines and bit lines, with each bit line being perpendicular to the plurality of word lines. A plurality of magnetic devices is also included where each magnetic device is disposed at an intersection of a word line and a bit line. Further a plurality of writing magnets is included where each writing magnet is disposed at an end of a magnetic device. During a write operation, writing magnets associated with a particular magnetic device switch a magnetic alignment of the particular magnetic device. In one aspect, a general MRAM array is disclosed wherein each magnetic device is associated with two writing magnets, and each writing magnet is associated with one magnetic device. In an additional aspect, a compact MRAM is disclosed wherein each writing magnet can be associated with two magnetic devices to increase the density of the array. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for low writing current MRAM. Embodiments of the present invention utilize a writing magnet comprised of a high permeability material. As a result, the writing current density required to process write operations is decreased by several orders of magnitude over that required by prior art MRAM devices. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
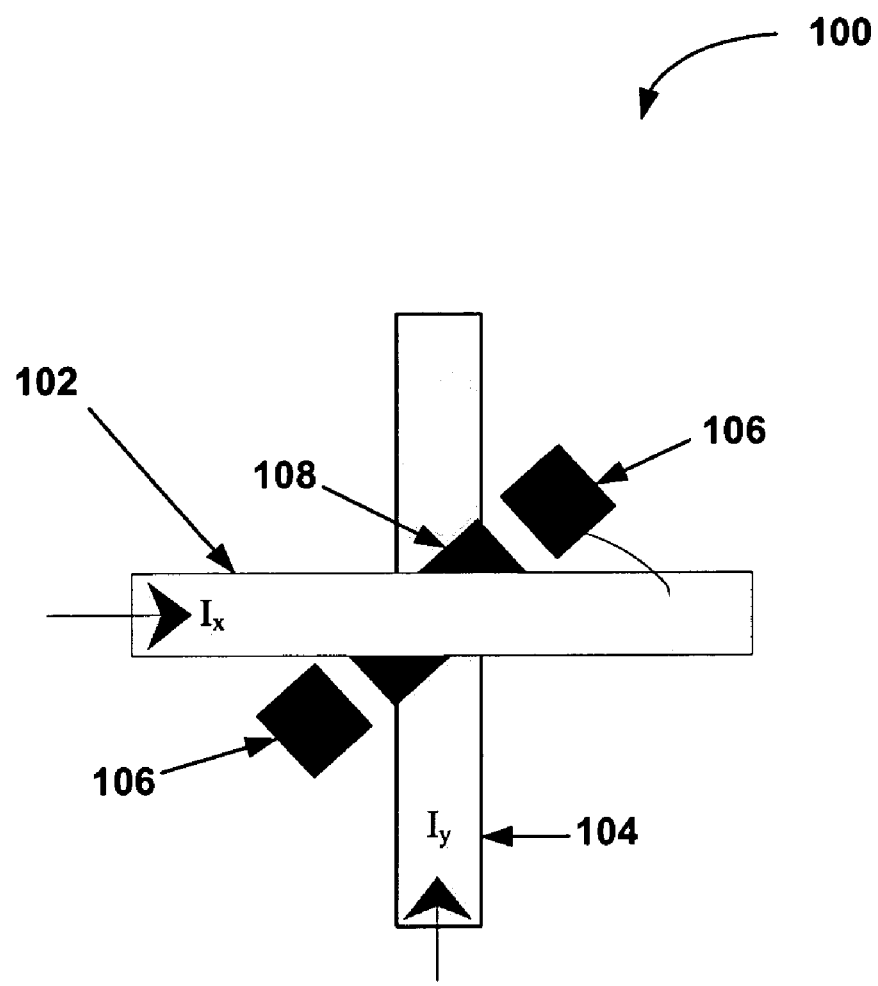
FIG. 1 is a diagram showing a single cell structure for a low write current MRAM, in accordance with an embodiment of the present invention.

FIG. 1 is a diagram showing a single cell structure 100 for a low write current MRAM, in accordance with an embodiment of the present invention. The single cell structure 100 includes a word line 102, a bit line 104, two writing magnets 106, and a magnetic device 108. Hereinafter, the word line 102 will be referred to as "metal line M1," and the bit line 104 will be referred to as "metal line M2." Each writing magnet can be a ferromagnetic material having high permeability value. The magnetic device 108 can comprise a magnetic tunnel junction (MTJ), giant magnetoresistance (GMR) material, colossus magnetoresistance (CMR) material, anisotropic magnetoresistance (AMR) material, or any other similar material as will be apparent to those skilled in the art after a careful reading of the present disclosure. MTJ and GMR material have two ferromagnetic layers separated by a thin insulator layer and a thin conductive layer, respectively. The long axis of the unit cell, including the two writing magnets (WM) 106 and magnetic device 108, preferably does not align with the metal lines 102 or 104.

When the magnetic device 108 comprises MJT, the pinned ferromagnetic layer can have a thickness in the range of about 3 to 20 nm, an insulator layer having a thickness in the range of about 0.7 to 3 nm, and a free ferromagnetic layer having a thickness in the range of about 3 to 20 nm. When the magnetic device 108 comprises GMR, the pinned ferromagnetic layer can have a thickness in the range of about 3 to 20 nm, a conductive layer having a thickness in the range of about 2 to 5 nm, and a free ferromagnetic layer having a thickness in the range of about 3 to 20 nm.

While writing, the x- and y-axis currents are introduced into the two metal lines M1 102 and M2 104 to produce a magnetic field on the two write magnets 106. The write magnets 106 cause enough field strength to switch the magnetic alignment of magnetic device 108.

Figure 2A:
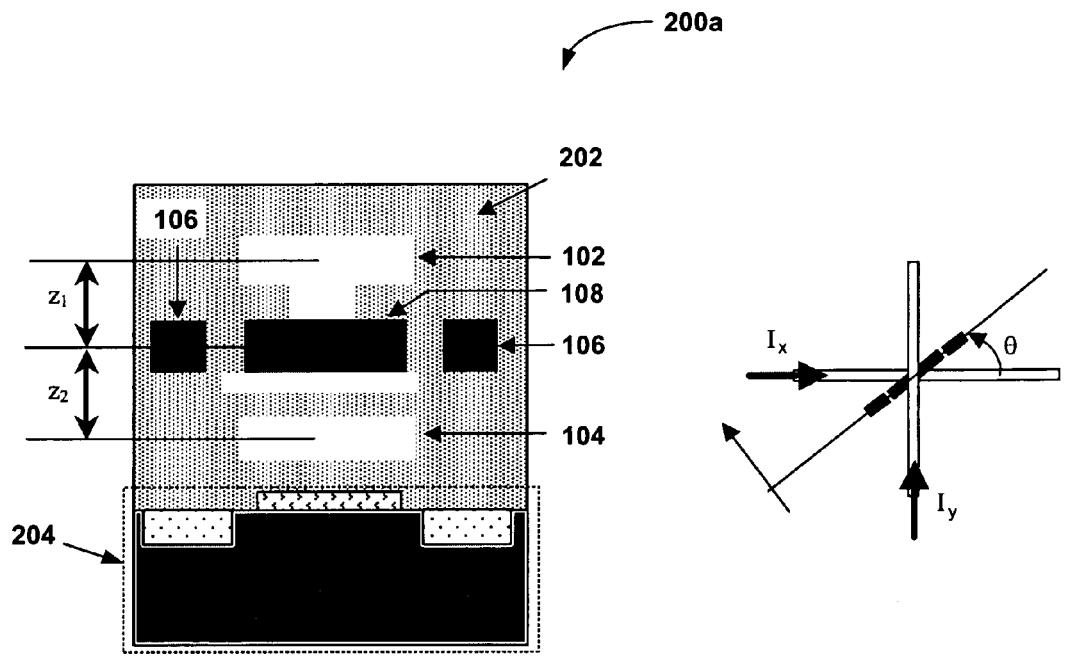
FIG. 2A is a cross-sectional view of the single cell structure along a 45° and to the x and y-axis.
Figure 2B:
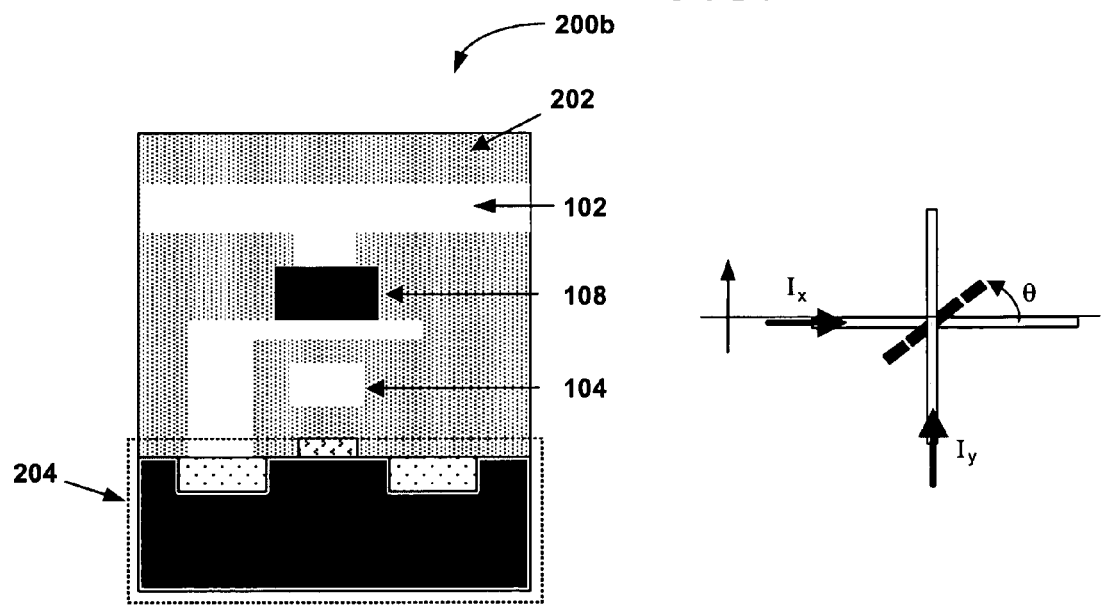
FIG. 2B is a cross-sectional view of the single cell structure along a view axis parallel to the to the y-axis.
Figure 2C:
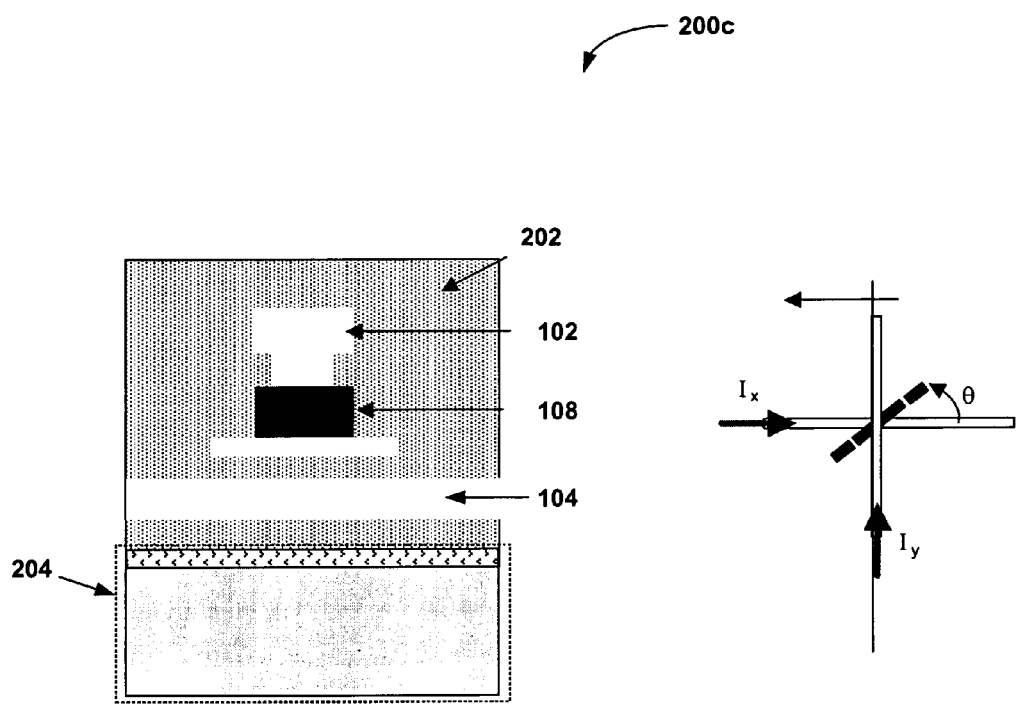
FIG. 2C is a cross-sectional view of the single cell structure along a view axis parallel to the to the x-axis.

FIGS. 2A-2C illustrate various cross-sectional views of the single cell structure 100 for a low write current MRAM, in accordance with an embodiment of the present invention. In particular FIG. 2A is a cross-sectional view 200a of the single cell structure along a 45° and to the x and y-axis. As illustrated in FIG. 2A, the single cell structure includes a metal line M1 102, a metal line M2 104, two writing magnets 106, and a magnetic device 108, all of which are disposed within an insulator 202. Below the metal line M2 104 is a transistor 204. Distance z1 defines the distance between the center of the metal line M1 102 and the center of the magnetic device 108, and distance z2 defines the distance between the center of the metal line M2 104 and the center of the magnetic device 108.

FIG. 2B is a cross-sectional view 200b of the single cell structure along a view axis parallel to the y-axis. The cross-sectional view 200b shows the metal line M1 102, metal line M2 104, and the magnetic device 108, all of which are disposed within an insulator 202. Below the metal line M2 104 is a transistor 204. FIG. 2C is a cross-sectional view 200c of the single cell structure along a view axis parallel to the x-axis. The cross-sectional view 200c shows the metal line M1 102, metal line M2 104, and the magnetic device 108, all of which are disposed within an insulator 202. Below the metal line M2 104 is a transistor 204.

Figure 3:
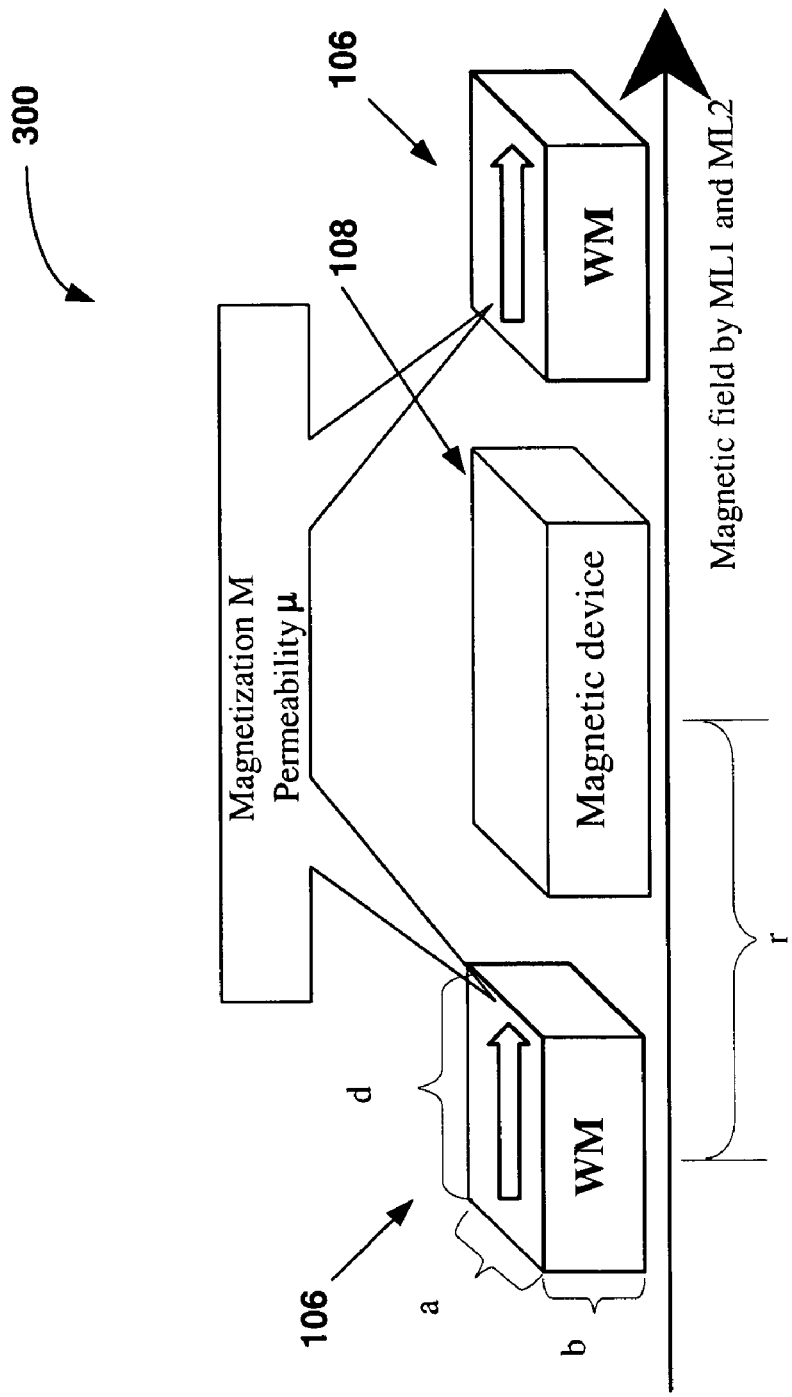
FIG. 3 illustrates the magnetic field generated by the metal lines m1 and m2 in the vicinity of the writing magnets and the magnetic device.

FIG. 3 illustrates the magnetic field 300 generated by the metal lines m1 102 and m2 in the vicinity of the writing magnets 106 and the magnetic device 108. Using the magnetostatic theory, the following equation can be derived:

$$H = \frac{\pi}{25} \times \left( I_x \frac{z_1}{(r\sin\theta)^2 + z_1^2} \sin\theta + I_y \frac{z_2}{(r\cos\theta)^2 + z_2^2} \cos\theta \right) \times \chi \times$$

$$\left( \frac{\left(r + \frac{d}{2}\right)^2}{\left(r + \frac{d}{2}\right)^2 + \frac{a^2 + b^2}{4}} - \frac{\left(r - \frac{d}{2}\right)^2}{\left(r - \frac{d}{2}\right)^2 + \frac{a^2 + b^2}{4}} \right) (Oe)$$

All the physical quantities are in C.G.S. units. Here, $\chi$ is the susceptibility value of the writing magnets 106. The relation of $\chi$ and $\mu$ is: $\chi = \mu - 1 = M/H_a$, where $H_a$ is the applied magnetic field by the metal lines ML1 102 and ML2 104 directly.

In principle, for a certain magnetic field, the larger value of $\chi$ implies the smaller applied current, $I_x$ and $I_y$. If the writing magnet 106 is paramagnetic or diamagnetic material, such as Cu, Ag, Al etc, $\chi = 0$, the above formula would show zero additional magnetic field from the writing magnets 106.

Figure 4:
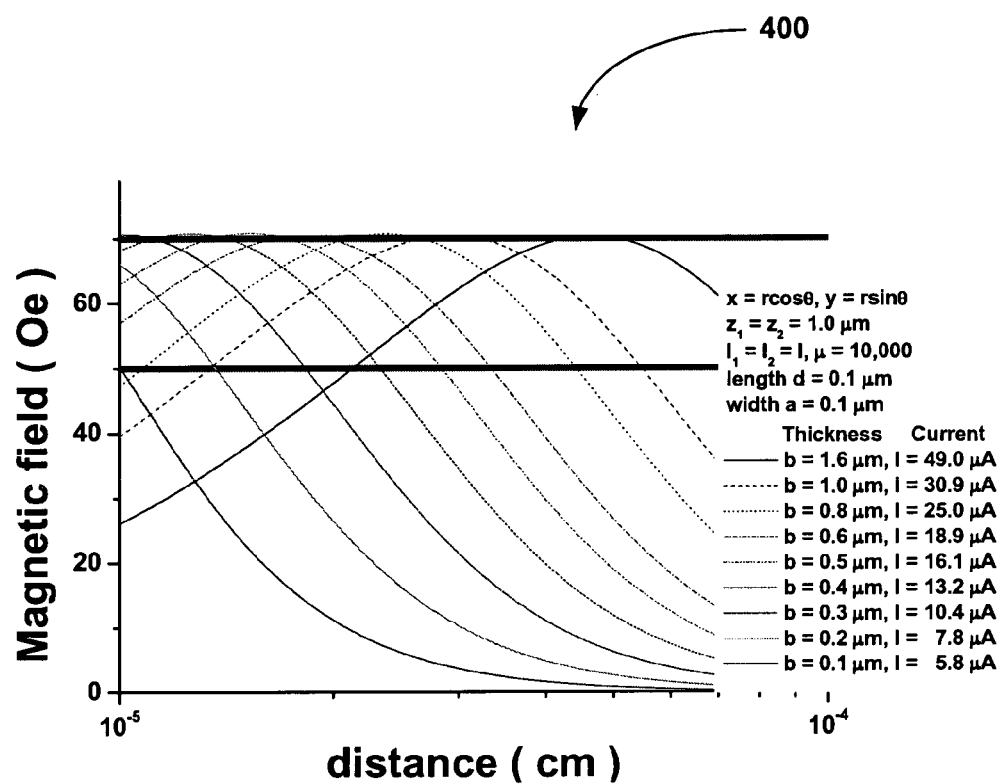
FIG. 4 is graph showing simulation results of sub-micron size when the writing magnet comprises a soft ferromagnetic material.

FIG. 4 is graph 400 showing simulation results of sub-micron size when the writing magnet comprises a soft ferromagnetic material (ex: $\mu = 10,000$). Set $$\left. \frac{dH}{dr} \right|_{H=70 Oe} = 0,$$

the influence of the deviation of the distance on the magnetic field is smallest.

Here, the writing magnet 106 is a soft ferromagnet that is permalloy or supermalloy, such as NiFe, NiFeMo, NiFeCu, NiFeCr, NiFeCuMo, or Fe-TM-B system (TM=IV~VIII group transition metal), such as Fe—Co—Ni—Zr—Ta—B, or Fe—(Al, Ga)—(P, C, B, Si) or Fe—(Co, Ni)—Zr—B, or Fe—(Co, Ni)—(Zr, Nb)—B, or Fe—(Co, Ni)—(Mo, W)—B, or Fe—Si—B, or Fe—Si—B—Nb—Cu, or Fe—Si—B—Nb, or Fe—Al—Ga—P—C—B—Si, or Fe—Co—Si—B—Cu—Nb, or Fe—Co—Ni—S, Co—Nb—Zr, or Fe—Zr—Nb—B, or Hiper50, or sendust, or FeTaC, or Fe—Ta—N—C etc. magnetic alloy or magnetic multilayer, such as FeAlN/SiN, or magnetic ceramic, such as $(MnO)_x(Fe_2O_3)_{1-x}$, $(ZnO)_x(Fe_2O_3)_{1-x}$, $(MnO)_x(ZnO)_y(Fe_2O_3)_{1-x}$ or $(NiO)_x(Fe_2O_3)_{1-x}$ etc. or magnetic oxide, or nitride, such as Fe—Hf—(O, N), Fe—Si—Al—(Ti, Ta)—(O, N), Fe—Hf—C—N, Fe—Co—Ni—N, Fe—Cr—O, Fe—(Cu, Rh)—Cr—O etc. or magnetic multilayer, such as $FeTaN/FeTaN_{rich}$, (Co, Fe)SiO/SiO.with a coercivity of 1~0.001 Oe and a permeability of 1000~1000000.

For a needed switching magnetic field of sensing element of 50~70 Oe, the applied writing current ranges the order of magnitude of 10 μA that is greatly smaller than that of the conventional MRAM design, which can require an order of the magnitude of 10 mA.

For line width and line thickness of ML1 102 and ML2 104 of 0.1 μm, the current density is around $10^5$ A/cm$^2$ that is greatly smaller than that of electron migration threshold of around $10^7$~$10^8$ A/cm$^2$.

The magnetic field induced by the metal lines ML1 102 and ML2 104 directly ranges 0.01~0.001 Oe that does not affect the applied field from writing magnets 106.

Figure 5:
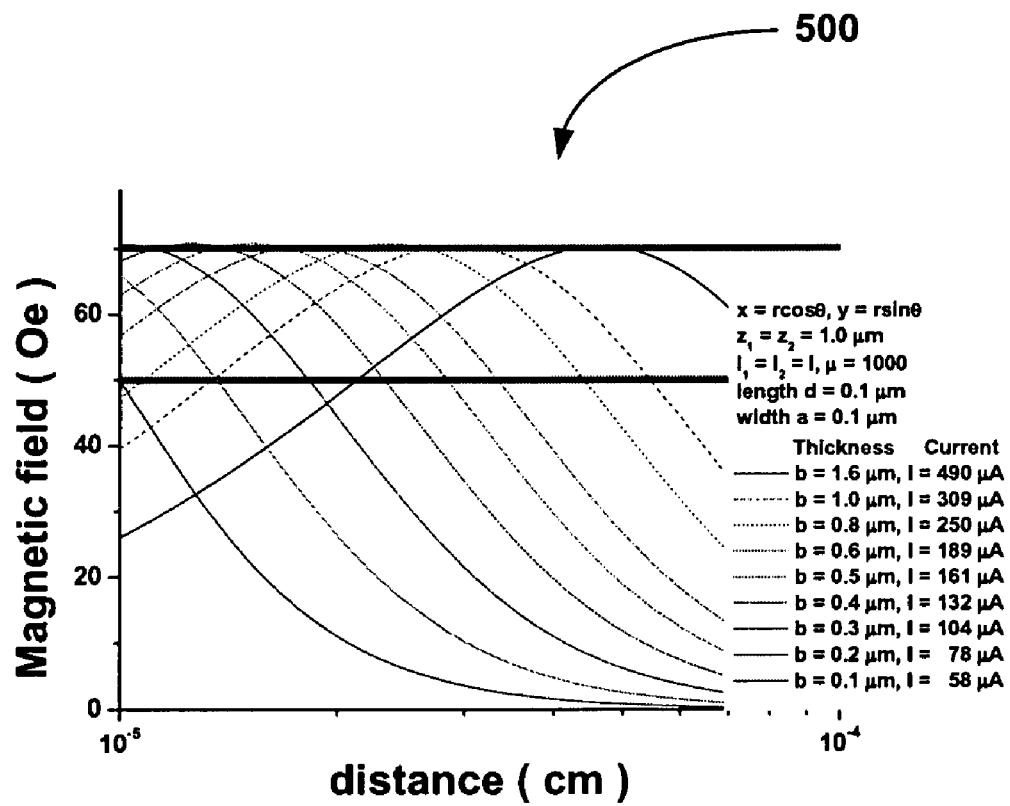
FIG. 5 is graph showing simulation results of sub-micron size when the writing magnet comprises a general ferromagnetic material.

FIG. 5 is graph 500 showing simulation results of submicron size when the writing magnet comprises a general ferromagnetic material (ex: μ=1000). Set $$\left.\frac{dH}{dr}\right|_{H=7Oe}=0,$$

the influence of the deviation of the distance on the magnetic field is smallest.

For a needed switching magnetic field of sensing element of 50~70 Oe, the applied writing current ranges the order of magnitude of 100 μA that is smaller than that of U.S. Pat. No. 6,163,477 of 10 mA, but larger than that of the above case (A) of 10 μA.

For line width of metal lines ML1 102 and ML2 104 of 0.1 μm, the current density is around $10^6$ A/cm$^2$ that is smaller than that of electron migration threshold of around $10^7$~$10^8$ A/cm$^2$.

By considering the current density issue and the minimum absolute deviation of magnetic field, |dH/dr|, the minimum permeability of writing magnets here is calculated to be 1000, if the required magnetic field ranges from 50 to 70 Oe. If lower, the current density approaches $10^7$ A/cm$^2$ for keeping the same magnetic field. The higher permeability value of the writing magnets is, the lower writing current density is used for keeping the same magnetic field.

For high permeability material as writing magnets, if the line width is 0.1 μm, the range of permeability value of 1000~1000000 means that the writing current ranges 0.1 μA~100 μA and the current density ranges $10^3$~$10^6$ A/cm$^2$.

The magnetic field produced by ML1 and ML2 directly at the position of magnetic device is about 1 Oe.

Figure 6:
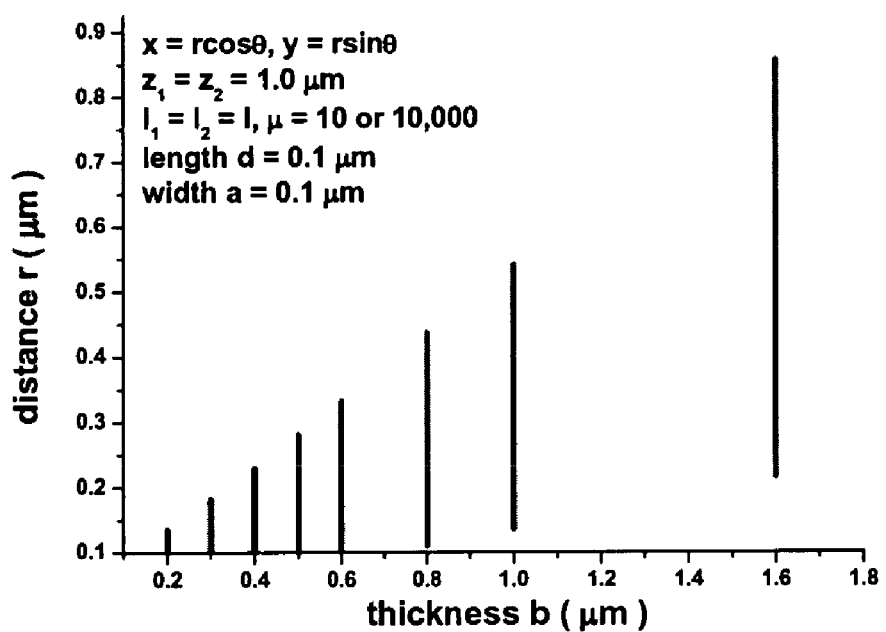
FIG. 6 is a graph showing acceptable distances r verses writing magnet thickness.
Figure 7:
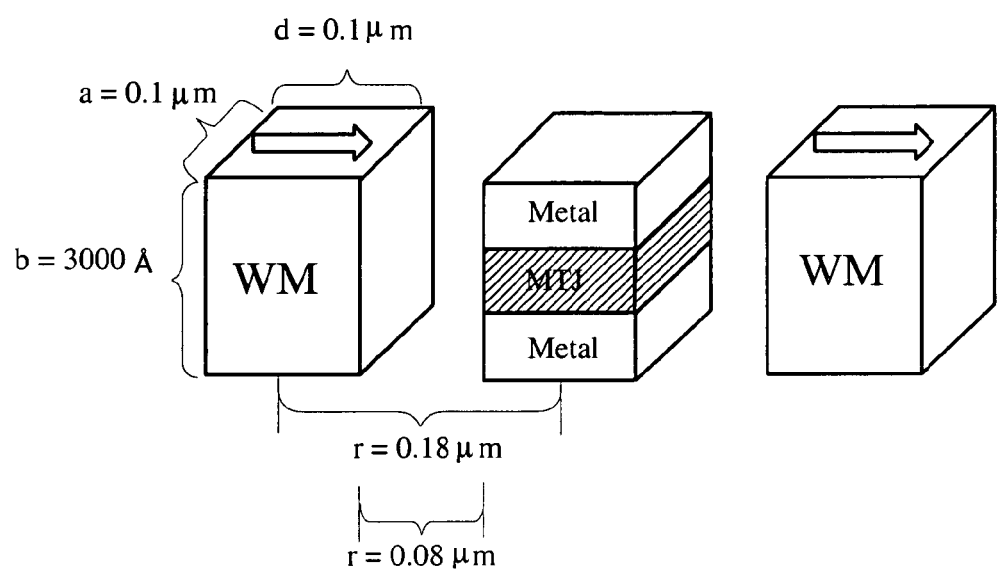
FIG. 7 illustrates an example memory cell wherein the thickness of the writing magnet is 3000 Å.

If the absolute value of deviation of magnetic field, |dH/dr|, is higher, the acceptable range of distance r that magnetic field can write the magnetic device is very narrow, for example, from 0.1 to 0.12 μm. For the magnetic field of the range of 50~70 Oe, the acceptable distance r versus writing magnet thickness is illustrated in FIG. 6. FIG. 7 illustrates an example case wherein the thickness of the writing magnet is 3000 Å.

Figure 8:
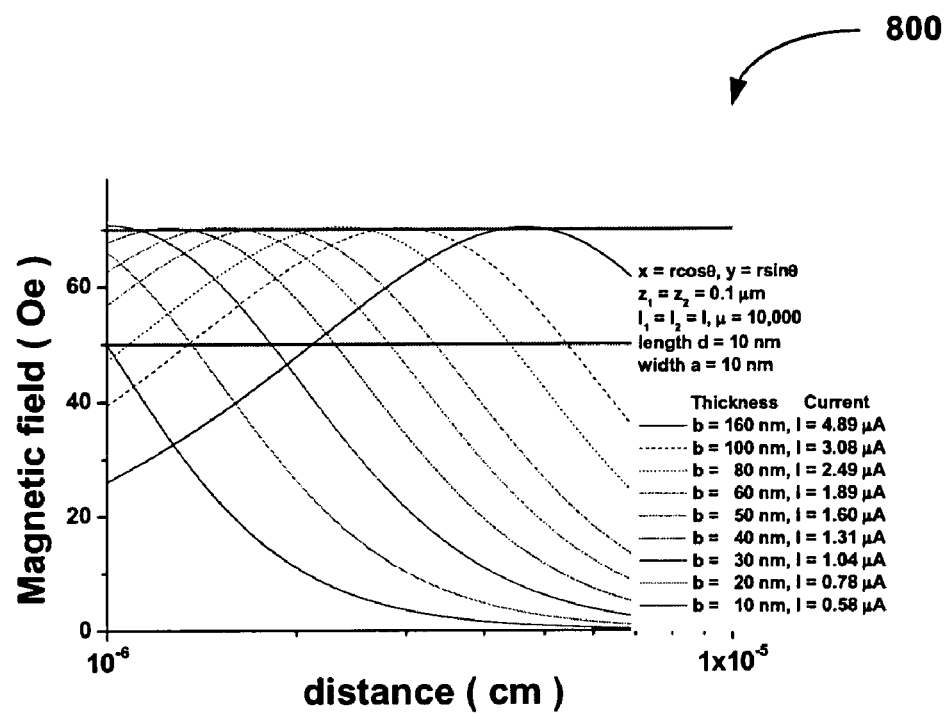
FIG. 8 is graph showing simulation results of 10 nm size.

FIG. 8 is graph 800 showing simulation results of 10 nm size. Set $$\left.\frac{dH}{dr}\right|_{H=7Oe}=0,$$

the influence of the deviation of the distance on the magnetic field is smallest.

The writing magnet is the same as above case of submicron size results. For a needed switching magnetic field of sensing element of 50~70 Oe, the applied writing current is around 1 μA. If the metal line has the thickness of 10 nm, the current density ranges $10^6$ A/cm$^2$ that is still be worked with keeping the reliability.

Figure 9:
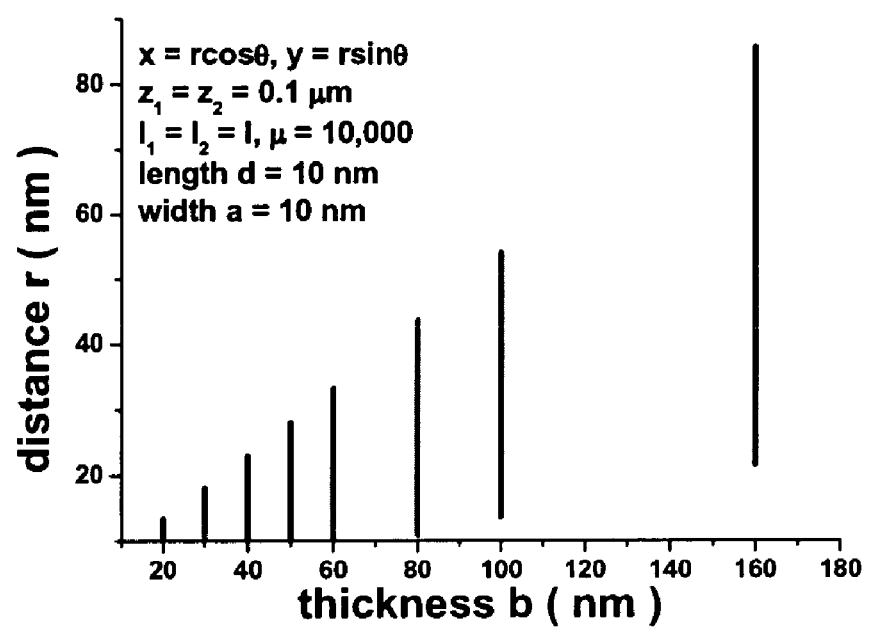
FIG. 9 illustrates the acceptable distance r versus the writing magnet thickness for the magnetic field of the range of 50~70 Oe.

By considering the current density issue and the minimum absolute deviation of magnetic field, |dH/dr|, the minimum permeability of WMs here is calculated to be 10000, if the required magnetic field ranges from 50 to 70 Oe. For high permeability material as WMs, if the line width is 10 nm, the range of permeability value of 10000~1000000 means that the writing current ranges 10 nA~1 μA and the current density ranges $10^4$~$10^6$ A/cm$^2$. FIG. 9 illustrates the acceptable distance r versus the writing magnet thickness for the magnetic field of the range of 50~70 Oe.

Figure 10:
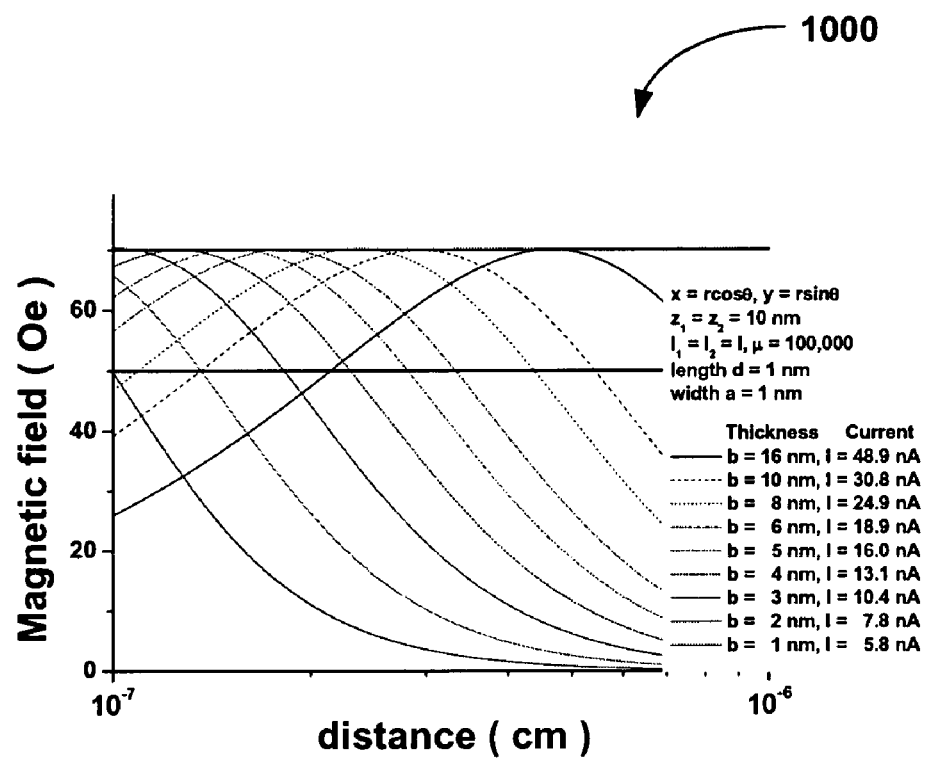
FIG. 10 is graph showing simulation results of 1 nm size.

FIG. 10 is graph 1000 showing simulation results of 1 nm size. Set $$\left.\frac{dH}{dr}\right|_{H=7Oe}=0,$$

the influence of the deviation of the distance on the magnetic field is smallest.

The writing magnet is the same as above case of submicron size results. For a needed switching magnetic field of sensing element of 50~70 Oe, the applied writing current is around 10 nA. If the metal line has the thickness of 1 nm, the current density ranges $10^6$ A/cm$^2$ that is still be worked with keeping the reliability. By considering the current density issue and the minimum absolute deviation of magnetic field, |dH/dr|, the minimum permeability of WMs here is calculated to be 100000, if the required magnetic field ranges from 50 to 70 Oe.

Figure 11:
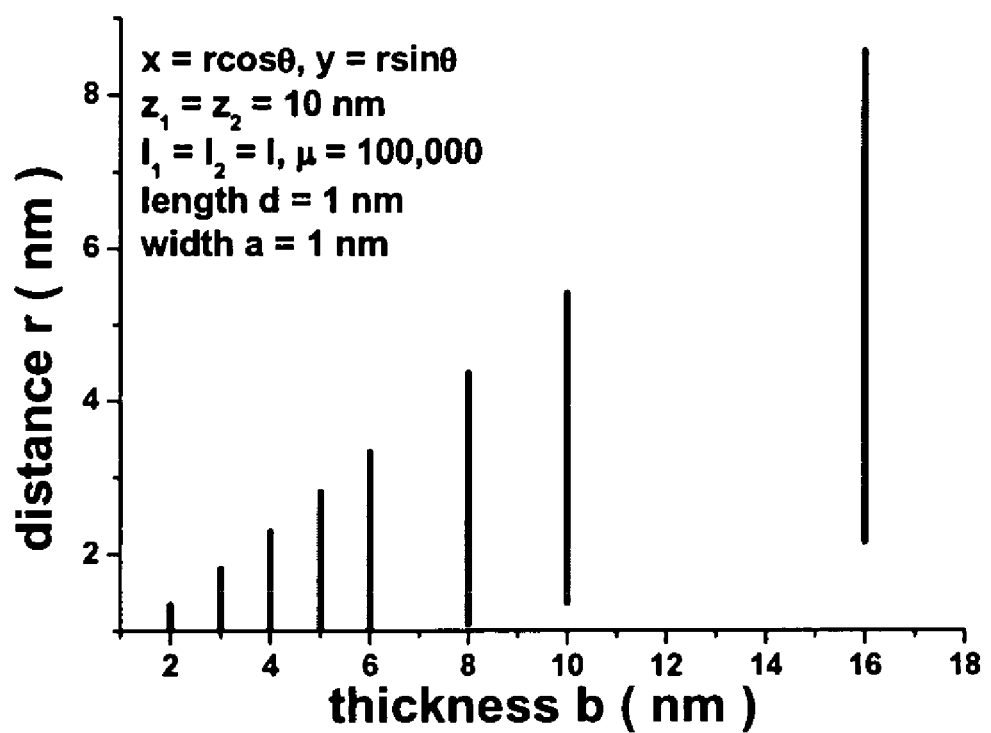
FIG. 11 illustrates the acceptable distance r versus the writing magnet thickness for the magnetic field of the range 50~70 Oe.

For high permeability material as writing magnets, if the line width is 10 nm, the range of permeability value of 100000~1000000 means that the writing current ranges 1 nA~10 nA and the current density ranges $10^5$~$10^6$ A/cm$^2$. FIG. 11 illustrates the acceptable distance r versus the writing magnet thickness for the magnetic field of the range 50~70 Oe.

Figure 12:
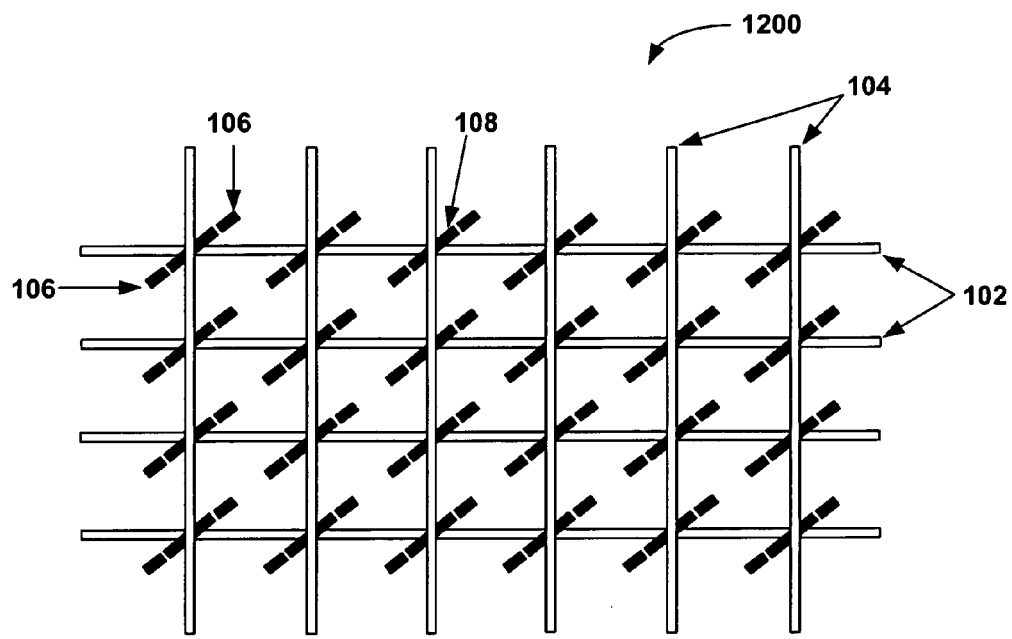
FIG. 12 is a diagram of a general memory arrangement using low write current memory cells, in accordance with an embodiment of the present invention.

FIG. 12 is a diagram of a general memory arrangement 1200 using low write current memory cells, in accordance with an embodiment of the present invention. The general memory arrangement 1200 includes a plurality of metal lines m1 102 utilized as word lines, and a plurality of metal lines m2 104 utilized as bit lines. Each intersection of a word line 102 and a bit line 104 forms a memory cell, which includes a magnetic device 108 and two writing magnets 106.

Figure 13:
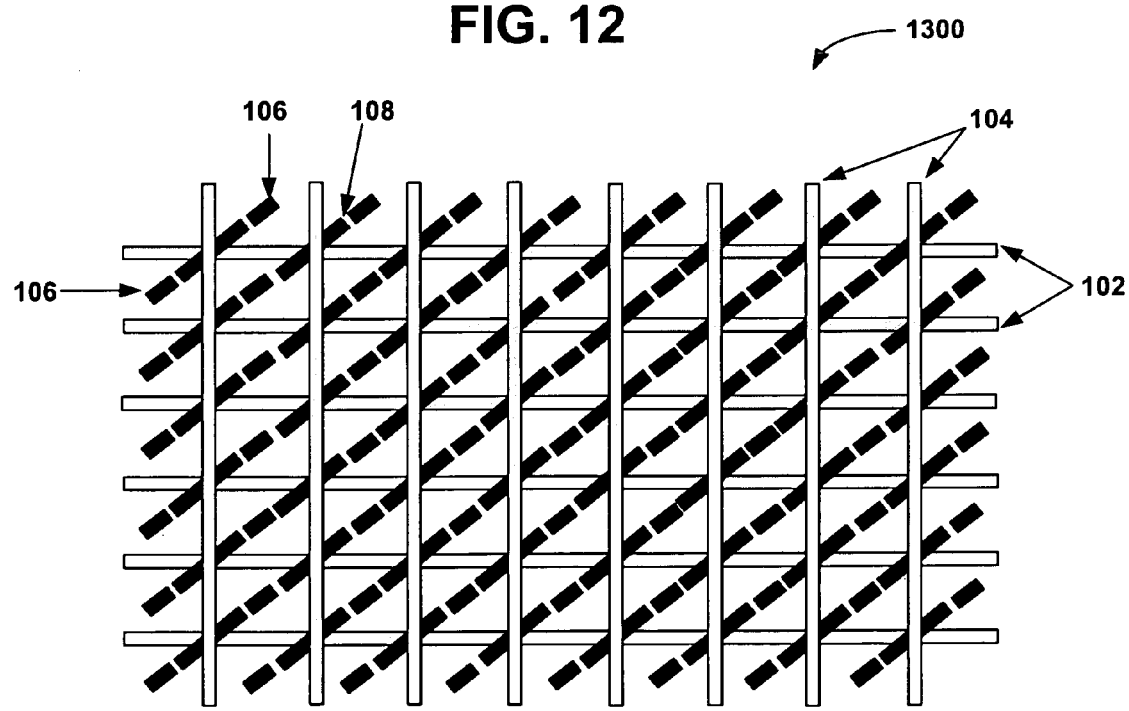
FIG. 13 is a diagram of a compact memory arrangement using low writing current memory cells, in accordance with an embodiment of the present invention.

FIG. 13 is a diagram of a compact memory arrangement 1300 using low write current memory cells, in accordance with an embodiment of the present invention. The compact memory arrangement 1300 includes a plurality of metal lines m1 102 utilized as word lines, and a plurality of metal lines m2 104 utilized as bit lines. Each intersection of a word line 102 and a bit line 104 forms a memory cell, which includes a magnetic device 108. However, unlike the general memory arrangement 1200 of FIG. 12, each memory cell the compact memory arrangement 1300 of FIG. 13 generally shares one or two writing magnets with a neighboring memory cell to increase the memory density.

When writing to a magnetic device 108, the metal lines ML1 102 and ML2 104 magnetize the two writing magnets 106 associated with the magnetic device 108. Both writing magnets contribute magnetic fields to the magnetic device 108 to write it. However, the magnetic field from one of the writing magnets cannot affect the neighboring magnetic device 108 because the magnetic field strength is not enough to write to the neighboring magnetic device 108. Hence, the writing process of each magnetic device 108 is independent. In both the general memory arrangement 1200 and the compact memory arrangement 1300 the writing process of the memory array can be simultaneous. That is, a region of the memory array comprising a plurality of contiguous memory cells can be written to simultaneously.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A magnetic random access memory (MRAM) cell, comprising:
   a word line;
   a bit line perpendicular to the word line;
   a magnetic device disposed at an intersection of the word line and the bit line, the magnetic device having a first end and a second end; and
   a pair of writing magnets, one of the pair of writing magnets disposed opposite the first end of the magnetic device and separated from the first end of the magnetic device by an insulator, another of the pair of writing magnets disposed opposite the second end of the magnetic device and separated from the second end of the magnetic device by an insulator, wherein the pair of writing magnets switches a magnetic alignment of the magnetic device during a write operation.

2. A MRAM cell as recited in claim 1, wherein a current in the word line and the bit line generates a magnetic field on the pair of writing magnets during the write operation.

3. A MRAM cell as recited in claim 1, wherein the pair of writing magnets and the magnetic device are aligned along a long axis of the memory cell.

4. A MRAM cell as recited in claim 3, wherein the long axis of the memory cell is not aligned with the word line and the long axis is not aligned with the bit line.

5. A MRAM cell as recited in claim 1, wherein the magnetic device includes a magnetic tunnel junction (MJT).

6. A MRAM cell as recited in claim 1, wherein the magnetic device includes a giant magnetoresistance (GMR) material.

7. A MRAM cell as recited in claim 1, wherein the magnetic device includes a colossus magnetoresistance (CMR) material.

8. A MRAM cell as recited in claim 1, wherein the magnetic device includes an anisotropic magnetoresistance (AMR) material.

9. A MRAM cell as recited in claim 1, wherein each writing magnet includes a soft ferromagnetic material.

10. A MRAM cell as recited in claim 1, wherein each writing magnet includes a general ferromagnetic material.

11. A method for performing a write operation to a magnetic random access memory (MRAM) cell, comprising the operations of:
    supplying a current to a word line and a bit line of the MRAM cell;
    generating a magnetic field using the currents in the word line and the bit line, wherein the magnetic field is applied to a pair of writing magnets disposed at either end of a magnetic device; and
    generating a field strength using the writing magnets, the field strength capable of switching a magnetic alignment of the magnetic device.

12. A method as recited in claim 11, wherein the current applied to the word line and the bit line is on an order of magnitude of 100 mA.

13. A method as recited in claim 11, wherein each writing magnet includes a soft ferromagnetic material.

14. A method as recited in claim 11, each writing magnet includes a general ferromagnetic material.

15. A method as recited in claim 11, wherein the pair of writing magnets and the magnetic device are aligned along a long axis of the memory cell.

16. A magnetic random access memory (MRAM) array, comprising:
    a plurality word lines and bit lines, each bit line being perpendicular to the plurality of word lines;
    a plurality of magnetic devices, each magnetic device disposed at an intersection of a word line and a bit line, and each magnetic device having a first end and a second end; and
    a plurality of writing magnets, each writing magnet disposed opposite one of the first and second ends of a magnetic device and separated from the first or second end of the magnetic device by an insulator, wherein writing magnets associated with a particular magnetic device switch a magnetic alignment of the particular magnetic device during a write operation.

17. A MRAM array as recited in claim 16, wherein each magnetic device is associated with two writing magnets, and wherein each writing magnet is associated with one magnetic device.

18. A MRAM array as recited in claim 16, wherein each magnetic device is associated with two writing magnets, and wherein each writing magnet can be associated with two magnetic devices.

19. A MRAM array as recited in claim 16, wherein a current in a particular word line and a current in a particular bit line generates a magnetic field on a pair of writing magnets during the write operation.

20. A MRAM array as recited in claim 19, wherein each intersection of a word line and a bit line includes a pair of writing magnets and the magnetic device that are aligned along a long axis of a memory cell formed at the intersection.

* * * * *